(12) United States Patent
Bauer et al.

(10) Patent No.: US 7,535,111 B2
(45) Date of Patent: May 19, 2009

(54) SEMICONDUCTOR COMPONENT WITH SEMICONDUCTOR CHIP AND ADHESIVE FILM, AND METHOD FOR ITS PRODUCTION

(75) Inventors: Michael Bauer, Nittendorf (DE); Kai Chong Chan, Singapore (SG)

(73) Assignee: Infineon Technologies AG, Munich (DE)

( * ) Notice: Subject to any disclaimer, the term of this patent is extended or adjusted under 35 U.S.C. 154(b) by 129 days.

(21) Appl. No.: 11/548,066

(22) Filed: Oct. 10, 2006

(65) Prior Publication Data

US 2007/0187816 A1 Aug. 16, 2007

(30) Foreign Application Priority Data

Oct. 10, 2005 (DE) .................. 10 2005 048 826

(51) Int. Cl.
*H01L 23/48* (2006.01)
*H01L 23/52* (2006.01)

(52) U.S. Cl. .................. 257/783; 257/787; 257/784; 257/E23.04; 438/113

(58) Field of Classification Search .................. 257/783, 257/784, 787, E23.04; 438/113
See application file for complete search history.

(56) References Cited

U.S. PATENT DOCUMENTS

| 5,260,413 | A | * | 11/1993 | Ochsner et al. | ............. 528/353 |
| 2001/0000480 | A1 | * | 4/2001 | Stagg et al. | .................... 428/43 |
| 2002/0048906 | A1 | * | 4/2002 | Sakai et al. | .................. 438/464 |
| 2003/0038378 | A1 | * | 2/2003 | Jacobs | ........................ 257/783 |
| 2003/0230814 | A1 | * | 12/2003 | Jaeger | ........................ 257/783 |
| 2004/0033382 | A1 | * | 2/2004 | Kendig | ....................... 428/518 |
| 2004/0104491 | A1 | * | 6/2004 | Connell et al. | ............. 257/787 |
| 2004/0118551 | A1 | * | 6/2004 | Czubarow et al. | .......... 165/80.3 |

FOREIGN PATENT DOCUMENTS

| DE | 10213293 A1 | 10/2003 |
| DE | 102004009742 A1 | 9/2005 |
| GB | 2404280 A | 1/2005 |
| WO | WO2005083779 A1 | 9/2005 |

* cited by examiner

*Primary Examiner*—Nitin Parekh
(74) *Attorney, Agent, or Firm*—Dicke, Billig, Czaja PLLC

(57) ABSTRACT

A semiconductor component with a semiconductor chip and an adhesive film, and a method for its production is disclosed. In one embodiment, the semiconductor component has the adhesive film, which is internally prestressed and is adhesive on both faces, between the rear face of the semiconductor chip and a chip connecting surface on a circuit mount.

12 Claims, 4 Drawing Sheets

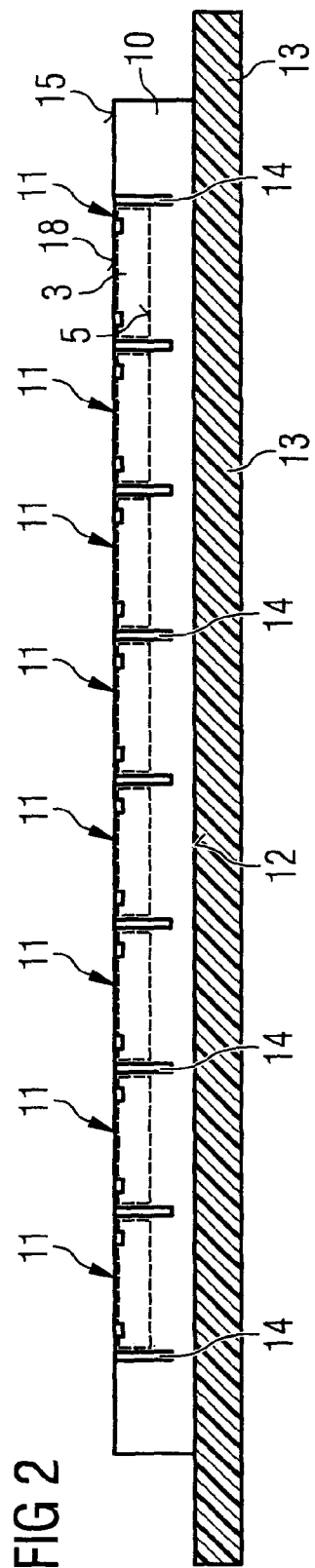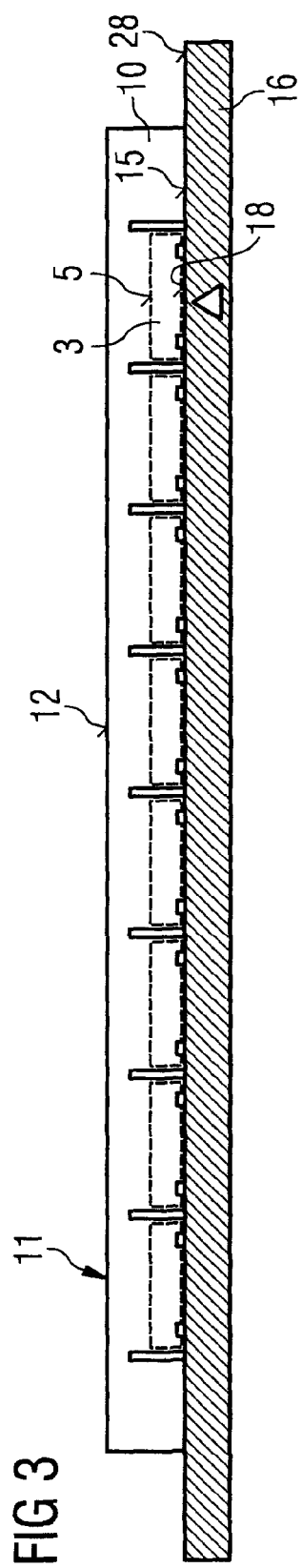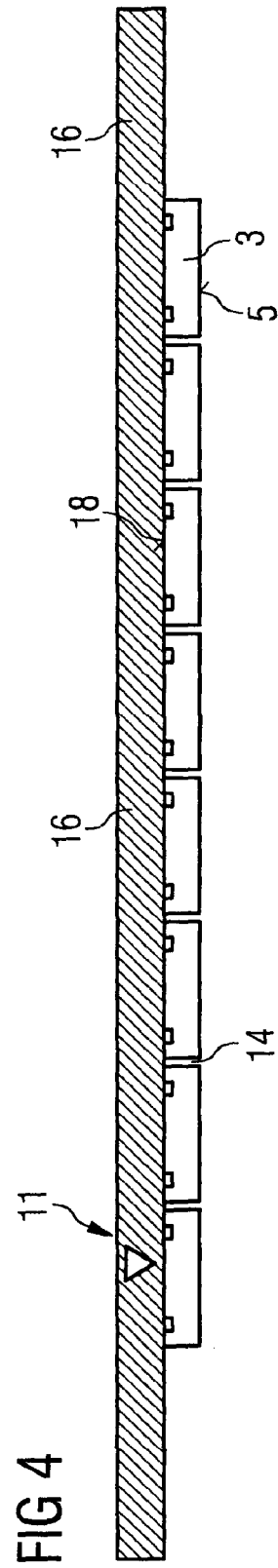

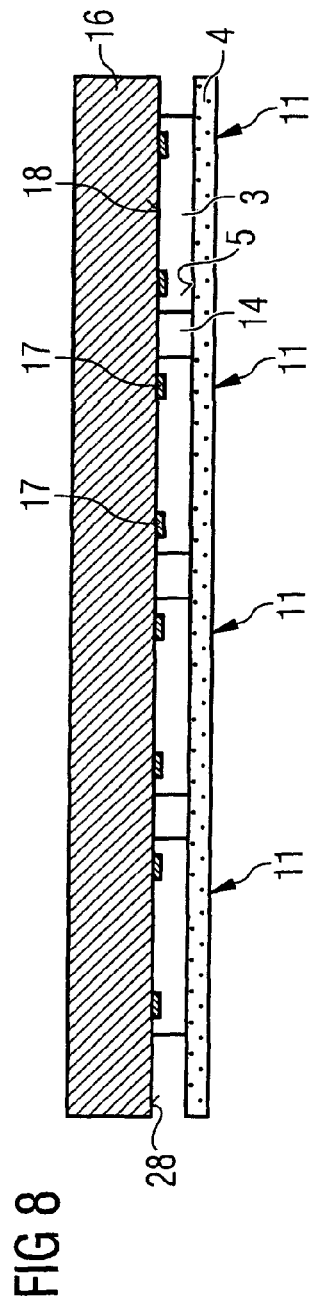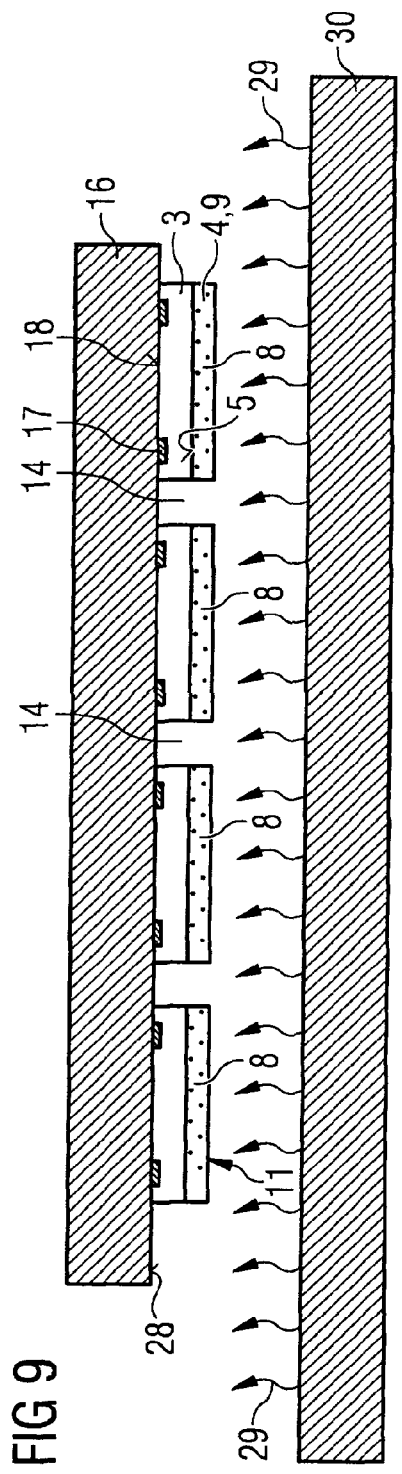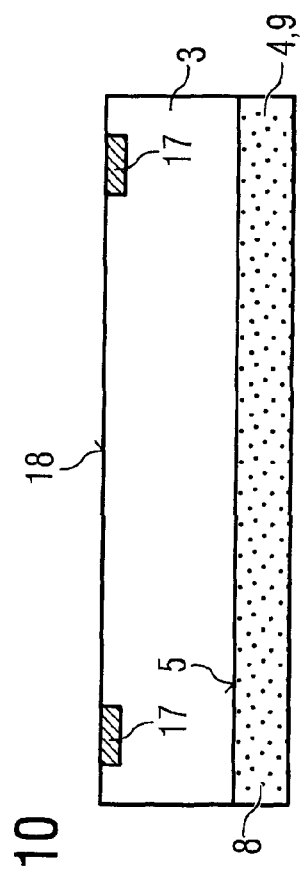

SEMICONDUCTOR COMPONENT WITH SEMICONDUCTOR CHIP AND ADHESIVE FILM, AND METHOD FOR ITS PRODUCTION

CROSS-REFERENCE TO RELATED APPLICATIONS

This Utility Patent Application claims priority to German Patent Application No. DE 10 2005 048 826.9 filed on Oct. 10, 2005, which is incorporated herein by reference.

BACKGROUND

The invention relates to a semiconductor component with a semiconductor chip and an adhesive film, and to a method for its production. In the case of semiconductor components such as these, the adhesive film is arranged between the rear face of the semiconductor chip and a chip connecting surface on a circuit mount. For this purpose, the adhesive film is not first of all adhesively bonded to the chip connecting surface, but the rear face of the semiconductor chip is provided with an adhesive film such as this. The application of an adhesive film such as this to the rear face of the semiconductor chip is not carried out on the individual rear faces of semiconductor chips but, in fact, on the rear face of a semiconductor wafer with a large number of semiconductor chip positions.

The document GB 2 404 280 A discloses a method for integral connection of a semiconductor chip, for which purpose a structure which includes a semiconductor wafer is removed from this mount by cutting through the semiconductor wafer using a laser beam, with the adhesive layer also being cut through at the same time in such a manner that individual semiconductor chips, to which the adhesive layers remain attached, can be removed from the wafer mount. The adhesive layers which have been cut through by means of the laser can then be fixed together with the semiconductor chip on a circuit mount, using an automatic placement machine.

This method has the disadvantage that the separation of the adhesive layer requires cutting through with laser ablation. During the laser ablation, there is a risk of both the edges and the active upper face of the semiconductor chip being contaminated with vaporized adhesive material. In other cases, the semiconductor wafer with a corresponding adhesive film is cut through by means of saw blades, and in this case the saw blades, which have diamonds on them and cut up the semiconductor wafer, are contaminated by the adhesive film in such a manner that the saw blades with the diamonds on them must be replaced prematurely.

In addition, in this case as well, the edges and the upper faces of the semiconductor chips are not protected against contamination by the material of the adhesive film. Furthermore, sawing through two different materials such as these is problematic and can lead to microcracks in the semiconductor material of the semiconductor wafer. If the separating processes are carried out separately, by first of all sawing the semiconductor wafer material and by then cutting through the adhesive film using a laser process, problems can likewise be expected, in particular contamination resulting from the vaporizing adhesive film material.

SUMMARY

One aspect of the invention provides a semiconductor component with a semiconductor chip and an adhesive film, and a method for its production. In one embodiment, the semiconductor component has the adhesive film, which is internally prestressed and is adhesive on both faces, between the rear face of the semiconductor chip and a chip connecting surface on a circuit mount.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2 to 10 illustrate outline sketches relating to the production of a semiconductor chip with a prestressed adhesive film.

FIG. 2 illustrates a schematic cross section through a semiconductor wafer with semiconductor chip positions after the introduction of separating joints.

FIG. 3 illustrates a schematic cross section through the semiconductor wafer as illustrated in FIG. 2, after the application of the semiconductor wafer to a semiconductor wafer mount.

FIG. 4 illustrates a schematic cross section through the semiconductor wafer as illustrated in FIG. 3, after thinning of the semiconductor wafer.

FIG. 5 illustrates a schematic plan view of an adhesive film that has been prestressed.

FIG. 6 illustrates a schematic cross section through the adhesive film as illustrated in FIG. 5, before the application of prestressing.

FIG. 7 illustrates a schematic cross section through the adhesive film as illustrated in FIG. 6 after the application of prestressing.

FIG. 8 illustrates a schematic cross section through a subarea of the thinned semiconductor wafer after application of the prestressed adhesive film.

FIG. 9 illustrates a schematic cross section through the subarea as illustrated in FIG. 8 after the adhesive film has been torn open in the separating joints.

FIG. 10 illustrates a single semiconductor chip with a prestressed adhesive film after removal of the semiconductor wafer mount.

DETAILED DESCRIPTION

Figure 1:
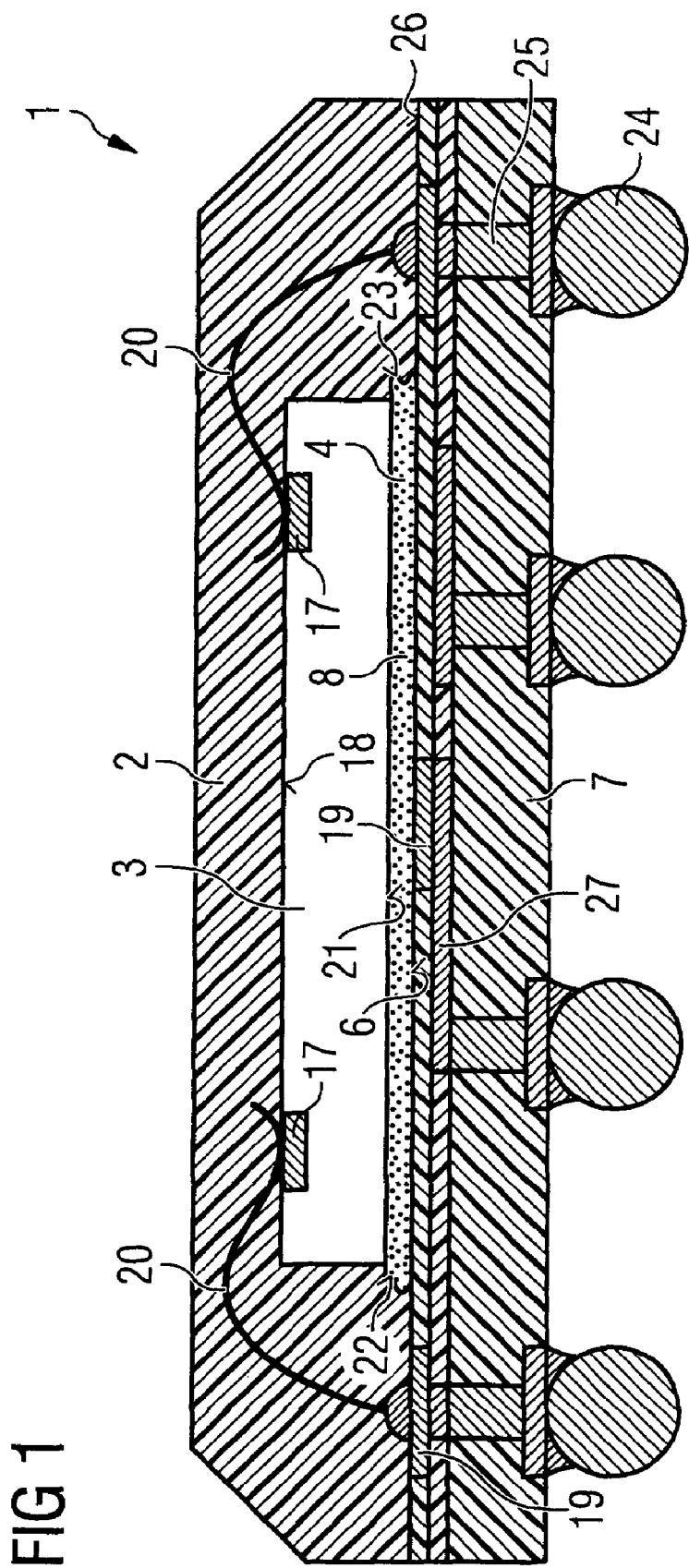
FIG. 1 illustrates a schematic cross section through a semiconductor component according to one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention is to specify a semiconductor component with semiconductor chips and an adhesive film and a method for its production, in which the disadvantages of the prior art are overcome and the process of sawing the semiconductor wafer is clearly distinguished from the process of separating the adhesive film. The aim is to achieve this by means of a novel semiconductor component and a novel method for its production.

According to one embodiment of the invention, a semiconductor component with a semiconductor chip and an adhesive film is provided, with the adhesive film being arranged between the rear face of the semiconductor chip and a chip connecting surface on a circuit mount. For this purpose, the adhesive film is internally prestressed, and is adhesive on both faces.

This prestressed adhesive film not only assists the process of holding the semiconductor component together, in particular holding the semiconductor chip and the circuit mount together, but also makes it possible for the adhesive film for a semiconductor component to be separated along separating joints in an appropriate manner for each semiconductor chip on a semiconductor wafer, since the internal prestressing which the adhesive film has on the rear faces of the semiconductor chip leads to the adhesive film being torn open and cut up in the separating joints, without any need to use additional aids, such as a laser ablation apparatus or a sawing separating technique.

For this purpose, the adhesive film is stretched biaxially in order to store such internal prestresses in the adhesive film material, which can be dissipated only in the area of the separating joints by tearing open the adhesive film and thus by separation of the adhesive film. The prestressing is very largely retained during assembly of the semiconductor component, and is thus also a component of the novel semiconductor component.

In one embodiment of the invention, the adhesive film is electrically conductive. For this purpose, a plastic material with a "memory effect" for prestresses can be filled with appropriate conductive particles, preferably composed of a silver alloy.

In a further embodiment of the invention, the adhesive film is composed of a shrink film. Shrink films such as these have a larger area extent at room temperature than after appropriate heating. When heated, shrink films such as these are subject to an area shrinking process in which case this shrinking process is impeded in the application according to the invention by the rear faces of the semiconductor chips on which the shrink film is adhesively bonded and fixed However, the shrinkage of the shrink-film material in the separating joints between the semiconductor chips leads to the films being torn open, so that no aids whatsoever are required to separate the shrink film, which is adhesive on both faces, for the individual semiconductor chips. This is associated with the fact that the separating process for the adhesive film can be carried out without any contact.

In a further embodiment of the invention, the adhesive film is in the form of an adhesive film which is applied to the rear face of a semiconductor wafer in a clamping frame, virtually in a mechanically prestressed state, with the prestressing on the wafer rear faces being maintained when the film is heated. However, this prestressing is dissipated in the separating joints by the film tearing, so that the films are separated on the rear faces of the individual semiconductor chips.

In a further embodiment of the invention, the semiconductor component has a thinned semiconductor chip with a prestressed rear-face film. It is extremely difficult to apply an adhesive film to a separated, thinned semiconductor chip without damaging the thinned semiconductor chip. In this case, the rear-face film, which is applied to a thinned semiconductor wafer in the prestressed state, provides a capability to provide a thinned semiconductor chip with a double-sided adhesive film on its rear face without any major mechanical load.

A method for production of a plurality of semiconductor chips with an adhesive film on the rear faces has the following method processes. First of all, a semiconductor wafer is produced with a large number of semiconductor chip positions arranged in rows and columns. The rear face of the semiconductor wafer is then applied to a mount film. Separating joints are now incorporated along the semiconductor chip positions, into the upper face of the semiconductor wafer in which case the separating joints do not cut completely through the semiconductor wafer. This at the same time ensures that the separating tool acts exclusively on semiconductor material and does not cut into the material of the mount film.

The semiconductor wafer with the separating joints on the upper face not cut through completely is then adhesively bonded to a semiconductor wafer mount and the mount film is removed from the rear face so that the rear face of the semiconductor wafer is now freely accessible. The semiconductor wafer can then be thinned from the rear face as far as the separating joints. After this step, there are now thinned semiconductor chips, which are separated from one another by the separating joints, on the semiconductor wafer mount.

In a next step, a prestressed adhesive film or a shrink film is applied to the rear face of the semiconductor wafer which has been cut up into semiconductor chips. Finally, the prestressed adhesive film on the rear faces of the semiconductor chips is heated, with the adhesive film being torn open along the separating joints. After this, the thinned semiconductor chips with prestressed adhesive film on their rear faces can be removed from the semiconductor wafer mount.

With this method, no additional tool whatsoever is required to cut through the prestressed electrically conductive plastic film. Furthermore, the plastic film is cut up without any contact into individual areas for the rear faces of the semiconductor chips, so that the plastic material which bridges the separating joints is torn open by the heat that is introduced. During this process, no bending forces whatsoever are exerted on the separate semiconductor chips, and in fact only a shear force is applied, although its direction corresponds to that for retention between the semiconductor chip, with a low coefficient of expansion, and the adhesive film.

In one implementation example of the method, a prestressed adhesive film is applied to the rear face of the semiconductor wafer, which has been cut up into semiconductor chips, by mechanically prestretching a plastic film over its area extent and by applying it in this prestretched form to the rear face of the semiconductor wafer which has been separated into semiconductor chips. A stretching frame is used in one case for this purpose, which ensures that the prestretching is maintained when the film is applied to the rear face of the semiconductor wafer.

Alternatively, the application of a prestressed adhesive film to the rear face of the semiconductor wafer which has been cut up into semiconductor chips can also be carried out by using a plastic film which has a memory effect for the prestress, with the area stretching of the film initiating storage of the prestress which leads to the film being torn open along the separating joints during subsequent heating of the adhesively bonded and prestressed film.

In a further implementation example of a method according to the invention, the application of a prestressed adhesive film to the rear face of the semiconductor wafer which has been cut up into semiconductor chips is carried out by using a shrink film which has an enlarged area extent at room temperature and tears open along the separating joints when subsequently heated. In this case, the shrinkage effect on the rear faces of the semiconductor chip is impeded, so that it is only possible to tear open in the separating joints.

As a result of these method examples, it is now possible to provide a semiconductor chip which on the one hand is thinned and on the other hand has a prestressed adhesive film on its rear face, by means of which it can be fixed on a corresponding circuit mount. In order to produce a plurality of semiconductor components, semiconductor chips which have been prepared in this way and are provided with an adhesive film on the rear face are applied to a circuit mount with corresponding semiconductor component positions in an automatic placement machine. Once the semiconductor chips with their adhesive films have been applied to the circuit mount, contact surfaces on the upper face of the semiconductor chips are then electrically connected to corresponding contact connecting surfaces on the circuit mount via connecting elements in the semiconductor component positions of the circuit mount. After this, the semiconductor chip with the rear-face film and the connecting elements as well as parts of the circuit mount can be embedded in a plastic encapsulation compound. The circuit mount is finally cut up into individual semiconductor components.

The method for production of semiconductor components such as these provides that the thinned semiconductor chips can be fixed at a suitable point in a semiconductor component without having to touch them directly because of the fact that they already have their adhesive film on their rear face. In this case, a simple temperature process allows separation of the adhesive film for the individual semiconductor chips in a semiconductor wafer.

FIG. 1 illustrates a schematic cross section through a semiconductor component 1 according to one embodiment of the invention. The semiconductor component 1 has a circuit mount 7 which has an adhesive film 4 on a chip connecting surface 6, on which adhesive film 4 the rear face 5 of a semiconductor chip 3 is in turn fixed. This semiconductor chip 3 is thinned to a few tens of micrometers, so that the mechanical robustness of the semiconductor component 1 is ensured by the circuit mount 7. The adhesive film 4 between the semiconductor chip and the circuit mount 7 is prestressed, that is to say its plastic chain molecules have been strained or stretched. In consequence, shear stresses are formed between the boundary surface of the rear face 5 of the semiconductor chip 3 and the upper face 21 of the adhesive film 4.

This accommodates the dissipation of thermal stresses, since the thermal coefficient of expansion of the semiconductor chip 3 is less than the thermal coefficient of expansion of the adhesive film 4, although these differences are cancelled out by the prestressing when appropriately heated during operation of the semiconductor component 1. Furthermore, the adhesion capability of the adhesive film 4 to the semiconductor chip material is sufficiently high that it is fixed firmly, and with internal prestress, on the rear face 5 of the semiconductor chip 3. The edges of the adhesive film 22 and 23 are illustrated slightly frayed in order to indicate that the prestressing in the interior of the adhesive film 4 has led to the adhesive film 4 being torn open at the edges 22 and 23. This tearing open of the adhesive film 4 takes place during separation of a plurality of semiconductor chips, which are arranged alongside one another, on a semiconductor wafer, by heating the prestressed adhesive film 4 by means of an appropriate heating surface or lamp.

The internal prestress in the prestressed adhesive film 4 is not dissipated in the area of the semiconductor chip 3 to the extent that would result from tearing off at the edges 22 and 23. However, the semiconductor component 1 passes through a plurality of high-temperature processes during its production, during which it is possible for the prestress in the electrically conductive plastic film 4 to be gradually dissipated.

The rest of the design of this semiconductor component 1 corresponds to conventional components with surface mountable external contacts 24, which in this case are electrically connected through vias 25 and contact connecting surfaces 19 on the upper face 26 of the circuit mount 7 and by corresponding connecting elements 20 to contact surfaces 17 on the upper face 18 of the semiconductor chip 3.

On the upper face 26, the circuit mount 7 has a wiring structure 27 via which one of the external contacts 24 is connected to the adhesive film 4. The entire structure of the semiconductor component 1 is protected by a plastic encapsulation compound 2, which embeds both the connecting elements 20 and the semiconductor chip 3 as well as the upper face 26 of the circuit mount 7.

FIGS. 2 to 10 illustrate outline sketches relating to the production of a semiconductor chip 3 with a prestressed adhesive film 4.

FIG. 2 illustrates a schematic cross section through a semiconductor wafer 10 with semiconductor chip positions 11 after the introduction of separating joints 14 from an active upper face 15 of the semiconductor wafer 10. These separating joins 14 do not cut through the semiconductor wafer 10 completely, but only as far as is required for formation of a rear face 5 of the semiconductor chips 3, as indicated by dotted lines. Once separating joints 14 such as these have been introduced from the upper face 15 of the semiconductor wafer 10, the semiconductor wafer 10 is adhesively bonded by its upper face 15 to a semiconductor wafer mount 16, and the mount film 13 is removed in order to allow the semiconductor wafer 10 to be thinned.

FIG. 3 illustrates a schematic cross section through the semiconductor wafer 10 as illustrated in FIG. 2 after application of the semiconductor wafer 10 to the semiconductor wafer mount 16. In this case, the separating joints 14 now also point in the direction of the upper face 28 of the semiconductor wafer mount 16. The rear face 12 of the semiconductor wafer 10 is now freely accessible, so that the semiconductor wafer 10 can be thinned from the rear face 12 until the rear faces 5 of the semiconductor chips 3 are reached.

FIG. 4 illustrates a schematic cross section through the semiconductor wafer 10 as illustrated in FIG. 3 after thinning of the semiconductor wafer 10. The upper faces 18 of the semiconductor chips 3 in the semiconductor component positions 11 are protected, as before, by the upper face 28 of the semiconductor wafer mount 16. In a subsequent step, the semiconductor chips 3 are now provided with an adhesive film on their rear faces 5 in the semiconductor component positions 11. A film is provided for this purpose, as can be seen in the following Figure.

Figure 5:
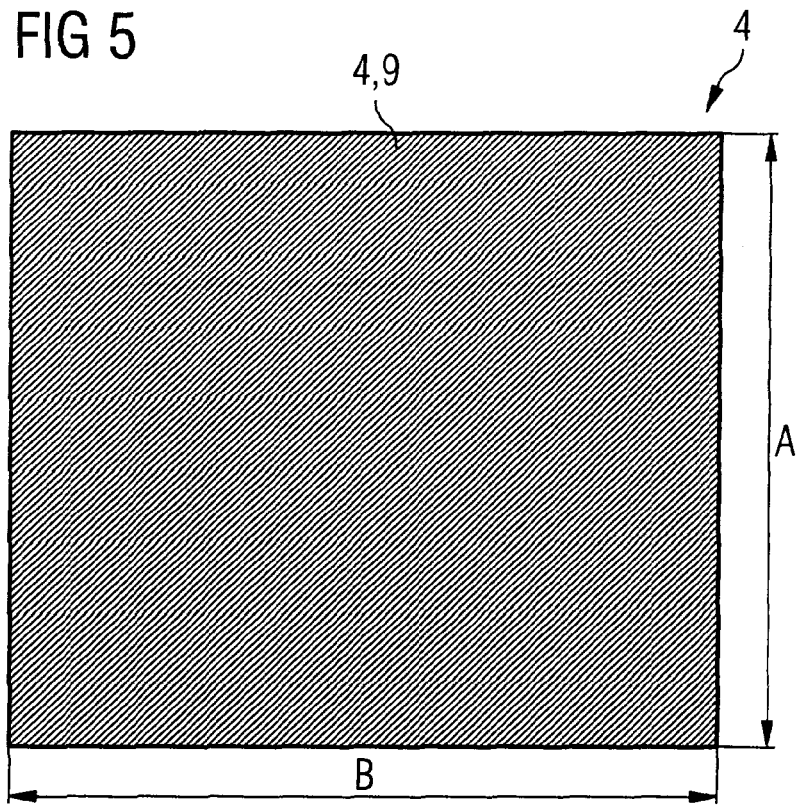

FIG. 5 illustrates a schematic plan view of a prestressed adhesive film 4. In order to apply prestressing to the film 4, the adhesive film 4 is prestretched in the directions of the arrows A and B thus forming internal prestresses in the adhesive film 4. Instead of a prestressed film 4, it is also possible to use a shrink film 9, whose area extent at room temperature is greater than at an appropriate heated-up temperature.

Figure 6:
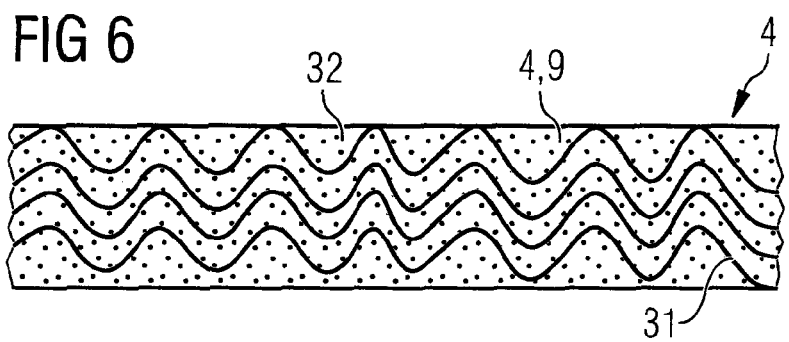

FIG. 6 illustrates a schematic cross section through the adhesive film 4 as illustrated in FIG. 5, before the application of prestressing. FIG. 6 illustrates the lattice of chain molecules in the plastic compound 32 of the adhesive film 4 just indicatively by corresponding wavy lines 31. When the film 4 is stretched in the directions mentioned above, these chain molecules are drawn apart from one another and are prestressed, thus resulting in the next outline Figure.

Figure 7:
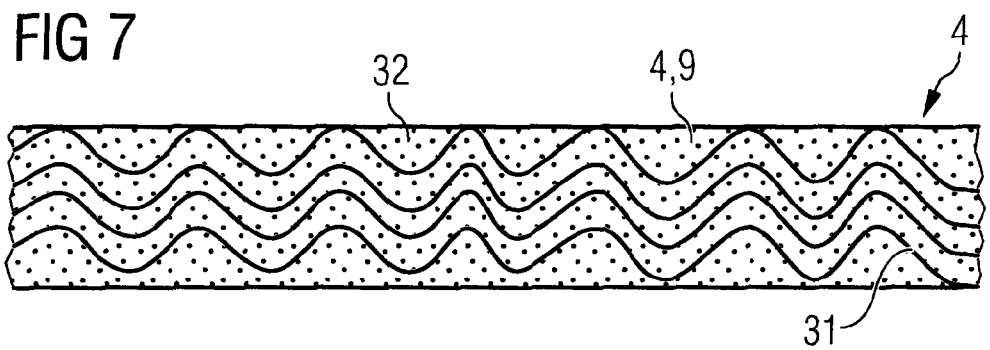

FIG. 7 illustrates a schematic cross section through the film 4 as illustrated in FIG. 6 after the application of prestressing. As FIG. 7 illustrates, the length of the film 4 is thus increased in the cross section, so that, when prestressing is applied over an area, the area extent of the film 4 is greater than when the film 4 is not prestressed.

FIG. 8 illustrates a subarea of the thinned semiconductor wafer 10 after the application of the prestressed adhesive film 4 to the rear faces 5 of the thinned semiconductor chips 3. As before, these semiconductor chips 3 are fixed by their active upper face 18 on the upper face 28 of the semiconductor wafer mount 16.

FIG. 9 illustrates a schematic cross section through the subarea as illustrated in FIG. 8 after the adhesive film 4 has been torn open in the separating joints 14. This tearing-open process takes place at the instant at which thermal radiation 29 from a heater 30 acts on the prestressed film 4. This heater 30 may also be an infrared lamp or may represent a hot plate. In both cases, this heat acts on the prestressed film 4 in the area of the separating joints 14, so that the adhesive film 4 is torn open in the separating joints 14, thus allowing separation of the adhesive film 4 on each of the semiconductor chips 3 to a rear-face film 8.

FIG. 10 illustrates a single semiconductor chip 3 with a prestressed adhesive film 4 as the rear-face film 8 after removal of the semiconductor wafer mount 16, as is illustrated in FIG. 9. If that subarea of the semiconductor wafer mount 16 which is illustrated in FIG. 9 is heated further, it can finally be removed from the semiconductor chips 3 with adhesive film 4 on the rear faces 5. This now results in a semiconductor chip 3 which can be used for the semiconductor component 1 according to the invention.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a semiconductor chip having an upper face and rear face; and
   an adhesive film between the rear face of the semiconductor chip and a chip connecting surface on a circuit mount;
   wherein the adhesive film is internally stressed has adhesive on both faces, and has frayed perimeter edges.

2. The semiconductor component as claimed in claim 1, wherein the adhesive film is electrically conductive.

3. The semiconductor component as claimed in claim 2, comprising wherein the semiconductor component has a thinned semiconductor chip with a shrink film on its rear face.

4. The semiconductor component as claimed in claim 1, wherein the adhesive film is a shrink film.

5. The semiconductor component as claimed in claim 1, wherein the adhesive film is a film which is applied in the prestressed state to the rear face of a semiconductor wafer.

6. The semiconductor component as claimed in claim 1, wherein the semiconductor component has a thinned semiconductor chip with a prestressed rear-face film.

7. A semiconductor component comprising:
   a semiconductor chip having an upper face and rear face;
   a circuit mount having a chip connecting surface;
   an internally stressed adhesive film having adhesive on both its faces, the adhesive film coupled between the rear face of the semiconductor chip and the chip connecting surface on a circuit mount; and
   means for internally prestressing the adhesive film.

8. The semiconductor component as claimed in claim 7, wherein the adhesive film is electrically conductive.

9. The semiconductor component as claimed in claim 8, comprising wherein the semiconductor component has a thinned semiconductor chip with a shrink film on its rear face.

10. The semiconductor component as claimed in claim 7, wherein the adhesive film is a shrink film.

11. The semiconductor component as claimed in claim 7, wherein the adhesive film is a film which is applied in the prestressed state to the rear face of a semiconductor wafer.

12. The semiconductor component as claimed in claim 7, wherein the semiconductor component has a thinned semiconductor chip with a prestressed rear-face film.

\* \* \* \* \*

UNITED STATES PATENT AND TRADEMARK OFFICE
CERTIFICATE OF CORRECTION

PATENT NO. : 7,535,111 B2  Page 1 of 1
APPLICATION NO. : 11/548066
DATED : May 19, 2009
INVENTOR(S) : Bauer et al.

It is certified that error appears in the above-identified patent and that said Letters Patent is hereby corrected as shown below:

On the Title Page, Item (30), Foreign Application Priority Data, delete "10 2005 048 826" and insert in place thereof --10 2005 048 826.9--.

On the Title Page, Item (74) Attorney, Agent, or Firm, delete "Dicke, Billig, Czaja PLLC" and insert in place thereof --Dicke, Billig & Czaja PLLC--.

Column 8, line 12, delete "stressed has" and insert in place thereof --stressed, has--.

Signed and Sealed this

Eleventh Day of August, 2009

David J. Kappos
*Director of the United States Patent and Trademark Office*